(12) United States Patent
Bernasconi et al.

(10) Patent No.: US 8,515,217 B2
(45) Date of Patent: Aug. 20, 2013

(54) VERTICAL OPTICALLY EMITTING PHOTONIC DEVICES WITH ELECTRONIC STEERING CAPABILITY

(75) Inventors: Pietro A.G. Bernasconi, Aberdeen, NJ (US); Young Kai Chen, Berkeley Heights, NJ (US); Christopher R. Doerr, Middletown, NJ (US); David T. Neilson, Old Bridge, NJ (US)

(73) Assignee: Alcatel Lucent, Paris (FR)

( * ) Notice: Subject to any disclaimer, the term of this patent is extended or adjusted under 35 U.S.C. 154(b) by 174 days.

(21) Appl. No.: 12/638,820

(22) Filed: Dec. 15, 2009

(65) Prior Publication Data

US 2011/0052114 A1     Mar. 3, 2011

Related U.S. Application Data

(60) Provisional application No. 61/239,301, filed on Sep. 2, 2009.

(51) Int. Cl.
*G02B 6/12* (2006.01)
*G02B 6/26* (2006.01)

(52) U.S. Cl.
USPC .................................. 385/14; 385/33; 385/37

(58) Field of Classification Search
None
See application file for complete search history.

(56) References Cited

U.S. PATENT DOCUMENTS

| | | | | |
|---|---|---|---|---|
| 4,760,569 A * | 7/1988 | Mahlein | | 398/139 |
| 4,969,712 A * | 11/1990 | Westwood et al. | | 385/14 |
| 5,195,150 A * | 3/1993 | Stegmueller et al. | | 385/33 |
| 5,218,584 A * | 6/1993 | Gfeller | | 369/44.12 |
| 5,835,646 A * | 11/1998 | Yoshimura et al. | | 385/14 |
| 5,854,868 A * | 12/1998 | Yoshimura et al. | | 385/50 |
| 6,487,328 B2 * | 11/2002 | Butler et al. | | 385/14 |
| 6,628,690 B1 * | 9/2003 | Fish et al. | | 372/50.1 |
| 7,206,472 B2 * | 4/2007 | Huang et al. | | 385/14 |
| 7,327,771 B2 * | 2/2008 | Kim et al. | | 372/64 |
| 7,346,242 B2 * | 3/2008 | Morlion et al. | | 385/52 |
| 7,349,614 B2 * | 3/2008 | Doan | | 385/131 |
| 7,555,176 B2 * | 6/2009 | Draxler et al. | | 385/14 |
| 7,650,052 B2 * | 1/2010 | Krishnamoorthy et al. | | 385/14 |
| 7,944,958 B2 * | 5/2011 | Konttinen et al. | | 372/45.013 |
| 2007/0263973 A1 * | 11/2007 | Van Laere et al. | | 385/129 |
| 2009/0290837 A1 * | 11/2009 | Chen et al. | | 385/37 |
| 2010/0092128 A1 * | 4/2010 | Okayama | | 385/14 |

FOREIGN PATENT DOCUMENTS

| | | | |
|---|---|---|---|
| JP | 61144609 A | | 7/1986 |
| JP | 08046292 A | * | 2/1996 |
| JP | 102009554 A | | 8/1998 |
| JP | 2005195991 A | * | 7/2005 |
| KR | 1020060017179 A | | 2/2006 |
| WO | WO 2007128022 A2 | * | 11/2007 |

* cited by examiner

*Primary Examiner* — Michelle R Connelly
(74) *Attorney, Agent, or Firm* — Hitt Gaines, PC

(57) ABSTRACT

An optical photonic device comprising a planar semiconductor substrate having a light-guiding layer thereon, a primary laser light source in said light-guiding layer and a vertical coupler optically coupled to the primary laser light source by waveguide portions of the light-guiding layer. The vertical coupler is configured to receive a light beam from the primary laser light source and redirect the light beam in a direction that is substantially perpendicular to a surface of the planar substrate.

16 Claims, 9 Drawing Sheets

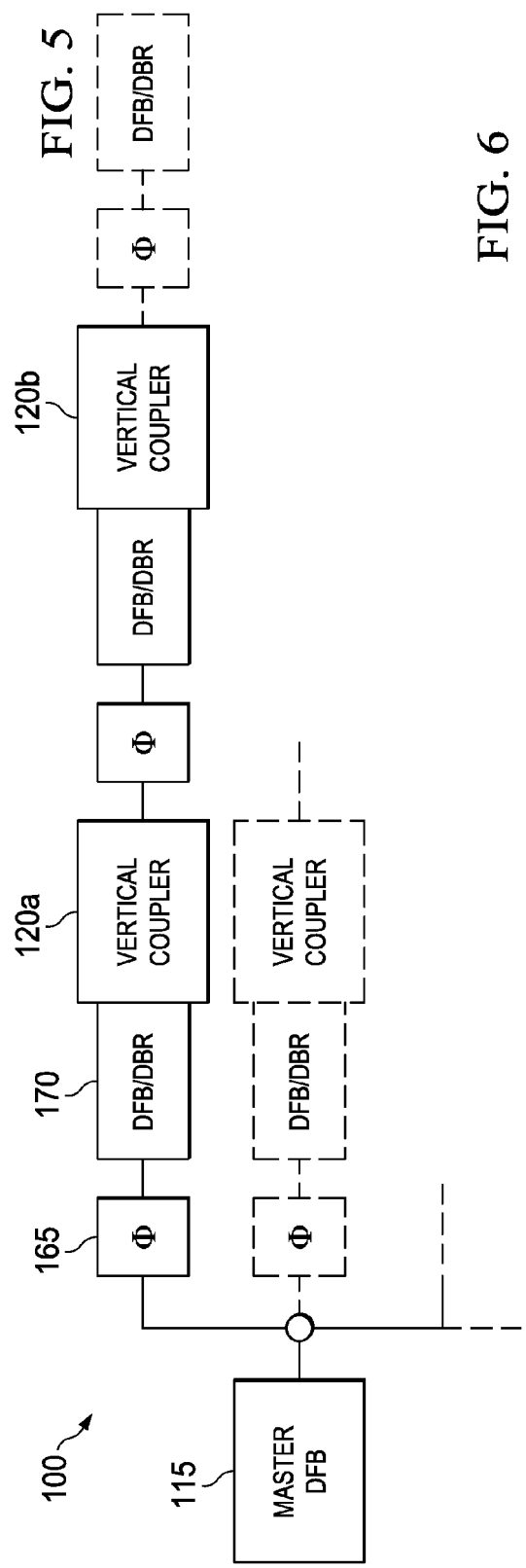
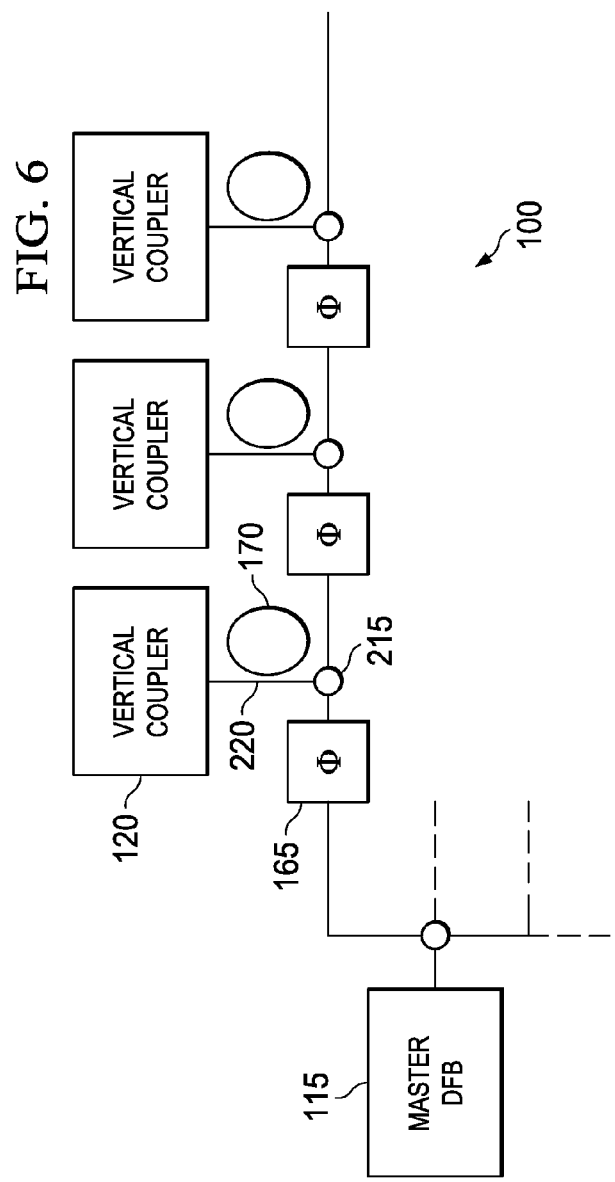

VERTICAL OPTICALLY EMITTING PHOTONIC DEVICES WITH ELECTRONIC STEERING CAPABILITY

CROSS-REFERENCE TO RELATED APPLICATION

This application claims the benefit of U.S. Provisional Application Ser. No. 61/239,301, filed by Sep. 2, 2009, entitled "VERTICAL OPTICALLY EMITTING PHOTONIC DEVICES WITH ELECTRONIC STEERING CAPABILITY," commonly assigned with this application and incorporated herein by reference.

TECHNICAL FIELD

The present disclosure is directed, in general, to photonic devices and more specifically, vertically optically emitting photonic devices, and, methods using and of manufacturing thereof.

BACKGROUND

This section introduces aspects that may be helpful to facilitating a better understanding of the inventions. Accordingly, the statements of this section are to be read in this light. The statements of this section are not to be understood as admissions about what is in the prior art or what is not in the prior art.

Optical beam steerers are often based on micro-electrical mechanical systems (MEMS), liquid crystal (LC) systems, acousto-optic (AO) systems, electro-optic (EO) systems, or injection locked laser systems, such as vertical cavity surface emitting lasers (VESEL). Each of these approaches to Optical beam steering can have problems, however. For instance, the speed of MEMS may be too slow for many video applications and even slower for applications that require precise analog steering. MEMS also cannot readily create multiple beams. The beam quality of LC systems can be high, can generate multiple beams, and the steering speed is fast enough for video. LC systems, however, are highly temperature sensitive and may not be amenable to integration with other optical components such as lasers. While steering can be fast, and the beam quality can be good, it may be difficult to steer in two dimensions and/or create multiple beams with an AO system. While the speed can be fast, EO beam steering at present appears to be limited to one-dimensional (1D) steering. The drawback to using VCSELs for beam steering with a photonic integrated circuit (PIC) is that they may be difficult to injection-lock using planar waveguides with a prescribed optical phase offset, and, it may be difficult to introduce individual electronic phase control.

SUMMARY OF THE DISCLOSURE

One embodiment is an optical photonic device. The device comprises a planar semiconductor substrate having a light-guiding layer thereon, a primary laser light source in the light-guiding layer and a vertical coupler optically coupled to the primary laser light source by waveguide portions of the light-guiding layer. The vertical coupler is configured to receive a light beam from the primary laser light source and redirect the light beam in a direction that is substantially perpendicular to a surface of the planar substrate.

Another embodiment is a method of using a photonic device. The method comprises emitting a light beam in a direction that is perpendicular to a surface of a planar photonic device substrate. Emitting includes generating a light beam in a primary laser in a light-guiding layer located on the planar substrate. Emitting also includes transmitting the light beam laterallly through waveguiding portions of the light guiding layer to a vertical coupler. Emitting also includes redirecting the light beam through the vertical coupler in the substantially perpendicular direction.

Another embodiment is a method of manufacturing a photonic device. The method comprises forming a light-guiding layer on a planar semiconductor substrate. The method also comprises implanting dopants into portions of the light-guiding layer to at least form grating structures for a primary laser. the method also comprises forming a vertical coupler on or in the light-guiding layer. The method also comprises patterning the light-guiding layer to form the primary laser light source and waveguide structures that optically couple the primary laser light source and the vertical coupler.

BRIEF DESCRIPTION OF THE DRAWINGS

The embodiments of the disclosure are best understood from the following detailed description, when read with the accompanying FIGUREs. Corresponding or like numbers or characters indicate corresponding or like structures. Various features may not be drawn to scale and may be arbitrarily increased or reduced in size for clarity of discussion. Reference is now made to the following descriptions taken in conjunction with the accompanying drawings, in which:

FIGS. 4-8 present plan views of example schematic layouts of an example photonic devices of the disclosure, such as the devices depicted in FIGS. 1A-1B;

DETAILED DESCRIPTION

The description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof. Additionally, the term, "or," as used herein, refers to an non-exclusive or, unless otherwise indicated. Also, the various embodiments described herein are not necessarily mutually exclusive, as some embodiments can be combined with one or more other embodiments to form new embodiments.

Figure 1A:
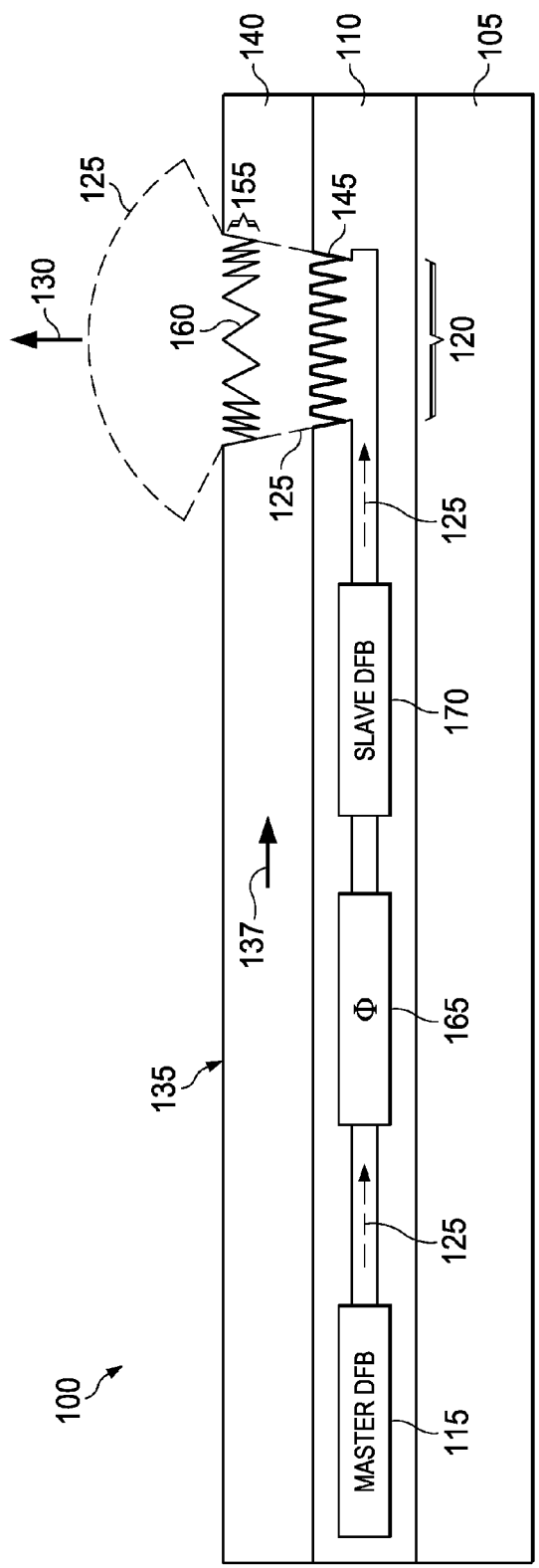
FIG. 1A presents a cross-sectional view of an example optical device of the disclosure.
Figure 1B:
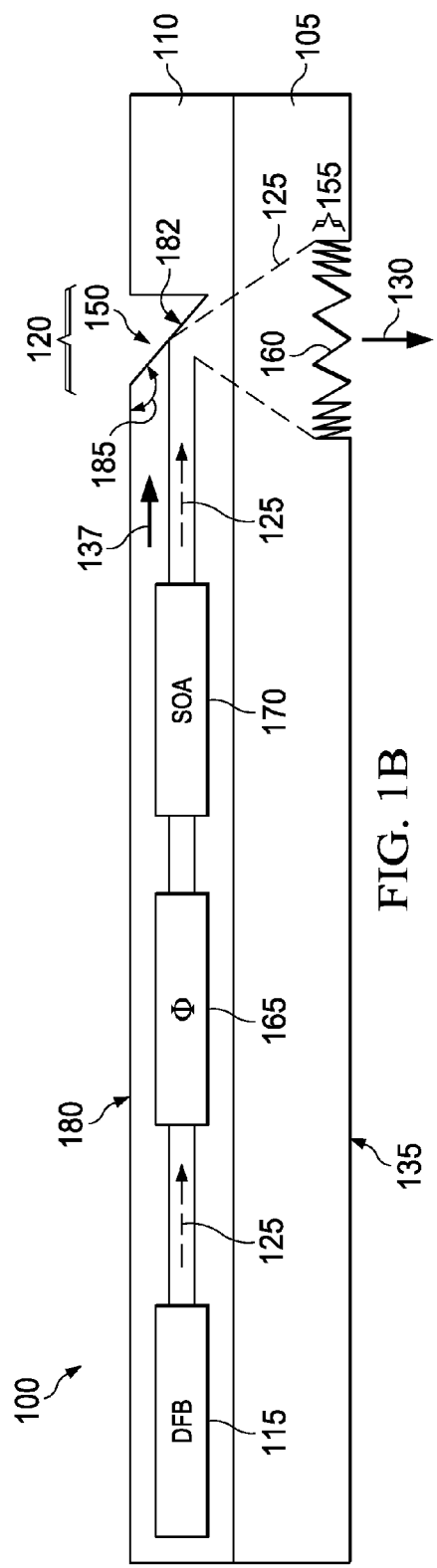
FIG. 1B presents a cross-sectional view of an example optical device of the disclosure.

One embodiment of the disclosure is an optical photonic device. FIGS. 1A and 1B present cross-sectional views of example optical photonic devices 100 of the disclosure. The device 100 comprises a planar semiconductor substrate 105 having a light-guiding layer 110 thereon. The device 100 also comprises a primary laser light source 115 in the light-guiding layer and a vertical coupler 120. The vertical coupler 120 is optically coupled to the primary laser light source 115 by waveguide portions of the light-guiding layer 110. The vertical coupler 120 is configured to receive a light beam 125 from the primary laser light source 115 and redirect the light beam in a direction 130 that is substantially perpendicular (e.g., 90±10 degrees) to a surface 135 of the planar substrate 105. For instance, the light beam 125 from the primary laser light source 115 can travel in a lateral direction 137 through the light guiding layer 110 and then be redirected in the perpendicular direction 130. The perpendicularly redirected light is sometimes referred to herein as vertically emitted light.

The primary laser light source 115 can be a distributed feedback (DFB) laser, distributed Bragg reflector (DBR) laser, semiconductor optical amplifier (SOA) or any other frequency-adjustable coherent light emitting source. The primary laser is sometimes referred to herein as a master laser or a master oscillator (MO).

In some embodiments, at least a portion of the planar semiconductor substrate 105 is configured as a lower cladding layer for the light-guiding layer 110 and the device 100 can further include an upper cladding layer 140 (FIG. 1A). The substrate 105 (or lower cladding layer of the substrate) and upper cladding layer 140 have a refractive index that is greater than the refractive index of the light guide layer 110. In some cases the upper cladding layer 140 has a refractive index that is substantially equal to a refractive index of the substrate 105 (or substrate portions configured as the lower cladding layer).

As illustrated in FIG. 1A, in some embodiments, the vertical coupler 120 includes a grating 145 located adjacent to or within said light-guiding layer 110. The grating 145 is configured to redirect the light beam 125 from the primary laser light source 115 to the substantially perpendicular direction 130. The grating 145 can be in the light guiding layer 110. Or, the grating 145 can be in an adjacent layer (e.g., the substrate 105 or an upper cladding layer 140) so long as the layer is close enough to influence the light beam 125 traveling inside the light guiding layer 110. Embodiments of the grating 145 can include a one-dimensional grating or a two-dimensional grating.

As illustrated in FIG. 1B, in some embodiments, the vertical coupler 120 includes a mirror 150 located adjacent to or within the light-guiding layer 110. The mirror 150 is configured to redirect the light beam 125 from the primary laser light source 115 to the substantially perpendicular direction 130.

As shown in FIGS. 1A and 1B, some embodiments of the device can further include a micro-lens 155 optically coupled to the vertical coupler 120. The micro-lens 155 is configured to collimate the light beam 125 emitted from the vertical coupler 120 in the substantially perpendicular direction 130. In some embodiments, the micro-lens 155 can be located in a layer adjacent to the wave-guiding layer 110 (e.g., the cladding layer 140 in FIG. 1A, or the substrate 105 in FIG. 1B). In other embodiments the microlens can be located in the wave-guiding layer 110.

Figure 1C:
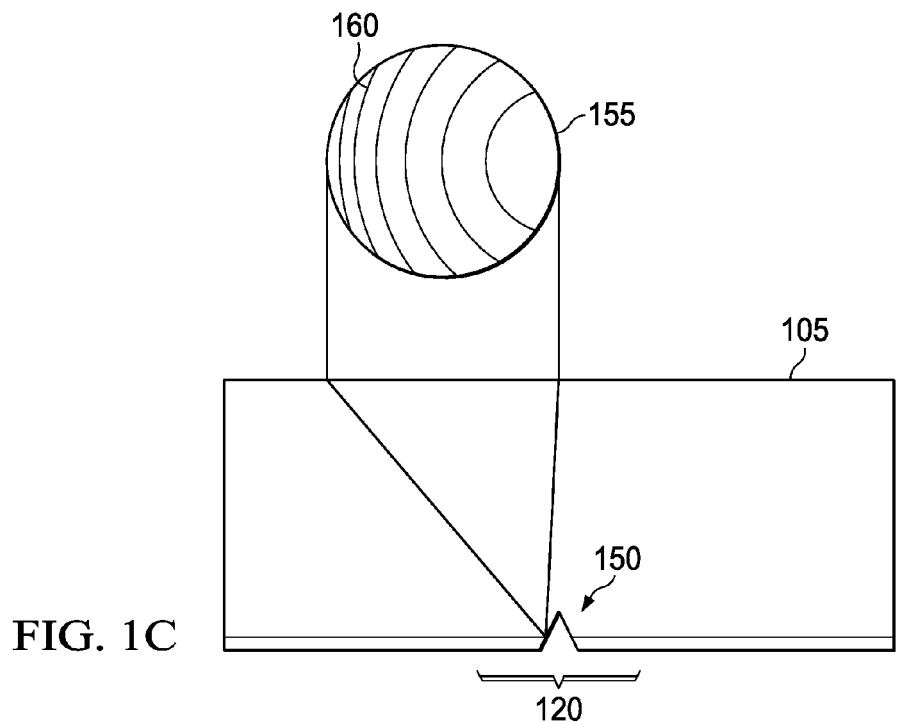
FIG. 1C shows cross-sectional and plan view of an example micro-lens of an optical photonic device such as the device depicted in FIG. 1B.

In some embodiments, the micro-lens 155 can be a diffractive lens that includes a series of concentric ridges 160 in an exterior surface 135 of the substrate 105 (e.g., FIG. 1B) or in the upper cladding layer 140 (e.g., FIG. 1A), or in the wave-guiding layer 110 (not shown). In some cases, the ridges 160 are circular concentric ridges. In other cases, such as shown in the detail cross-sectional and plan views of FIG. 1C, the ridges 160 of the lens 155 can be asymmetric concentric ridges (e.g., elliptical or other non-circular patterns) to receive light beams 125 emitted from the vertical coupler 125 at an angle other than 90 degrees to the plane of the substrate (e.g., about 80 to 89 degrees or about 91 to 110 degrees).

As shown in FIGS. 1A and 1B, in some embodiments, to facilitate light beam steering, the device 100 further includes a phase modulator 165 located in a light path between the primary laser light source 115 and the vertical coupler 120. The phase modulator 165 is sometimes referred to herein as a phase shifter or depicted with the greek symbol phi (Φ).

In some embodiments, the phase modulator 165 is a linear phase modulator such as an electrooptic modulator (e.g., a Pockel modulator). In other embodiments, the phase modulator 165 is a carrier-injected phase modulator. At low injection currents, the carrier-injected phase modulator can modulate the light beam's phase as a linear function of the injection current, while at higher injection currents, phase modulation can become a non-linear function of the injection current. In some cases an advantage of using a carrier-injected phase modulator compared to an electrooptic phase modulator is that a comparatively shorter short waveguide length and smaller injection current can be used to induce sufficiently large phase shifts for beam steering. This, in turn, facilitates the design of a compact device. In some cases a disadvantage of using a carrier-injected phase modulator compared to an electrooptic phase modulator it that at large injection currents, the free carriers can absorb the light 125. While electrooptic phase modulators 163 are not as prone to absorb the light 125, they can require the use longer waveguide lengths or stronger applied current to achieve similar degrees of phase modulation.

As shown in FIGS. 1A and 1B, in some embodiments, to facilitate light beam steering, the device 100 further includes an amplitude modulator 170 located in a light path between the primary laser light source 115 and the vertical coupler 120. The amplitude modulator is configured to receive a light beam 125 from the primary laser light source 115, and in some cases directly from a phase modulator 165 of the device 100. Embodiments of the amplitude modulator 170 include one or more a secondary laser, such as a DFB, DBR, or ring lasers, or a SOA. The primary laser 115 and optically coupled secondary laser 170 are sometimes referred to herein as master and slave lasers, respectively, because the primary laser 115 can be used to injection-lock the secondary laser 170 (or lasers) at the lazing frequency of the primary laser 115.

In some embodiments it is advantageous for the amplitude modulator 170 to be or include a ring laser because ring lasers can have lower power losses in the light beam 125 due to reflective losses. In comparison, DFB or DBR amplitude modulators 170 may reflect substantial amounts of the light 125 back towards the primary laser 115. In addition to losses in optical power the reflected light can cause heating of the primary laser 115 which in turn may destabilize the laser.

In some cases, as shown in FIGS. 1A and 1B, the amplitude modulator 170 can be discrete in that it is a separate structure from the primary laser light source 115 and the vertical coupler 120. For instance, discrete amplitude modulator 170 can be separated for other active device structures by one more wave-guiding portions of the light guiding layer 110.

In other cases however, embodiments of the amplitude modulator 170 (e.g., secondary DFB laser, DRB laser or ring laser) can be integrated with the vertical coupler 120 (not depicted in FIGS. 1A and 18). For example a grating 145 pattern for a vertical coupler 120 can be configured to both direct the light beam 125 in the substantial perpendicular direction 130 and to amplitude modulate the light beam 125, e.g., to facilitate beam steering. To facilitate such an integrated configuration, the pattern of the grating 145 can include elements (e.g., holes, posts, ridges, trenches) that are asymmetrically arranged or that have asymmetric shapes. For instance, the grating 145 can be configured to laze the light beam 125, e.g., by having a grating suitable for a DFB, DRB or ring laser. An injection current to the grating 145 can modulate the light beams' 125 amplitude. As an example, the vertical coupler 120 can include e.g., a DFB laser that has the grating 145 in or on the laser's active region, and the grating 145 can be modified to provide feedback to the laser cavity and to provide the vertical coupling out of the laser cavity. The grating's 145 design thereby supports the light's 125 lasing in the plain of the light-guiding layer 110 and provides the vertical output coupling into the free space above or below the light-guiding layer 110. This is in contrast to gratings in DFB lasers which are constructed to support lasing in the laser cavity only.

Figure 2:
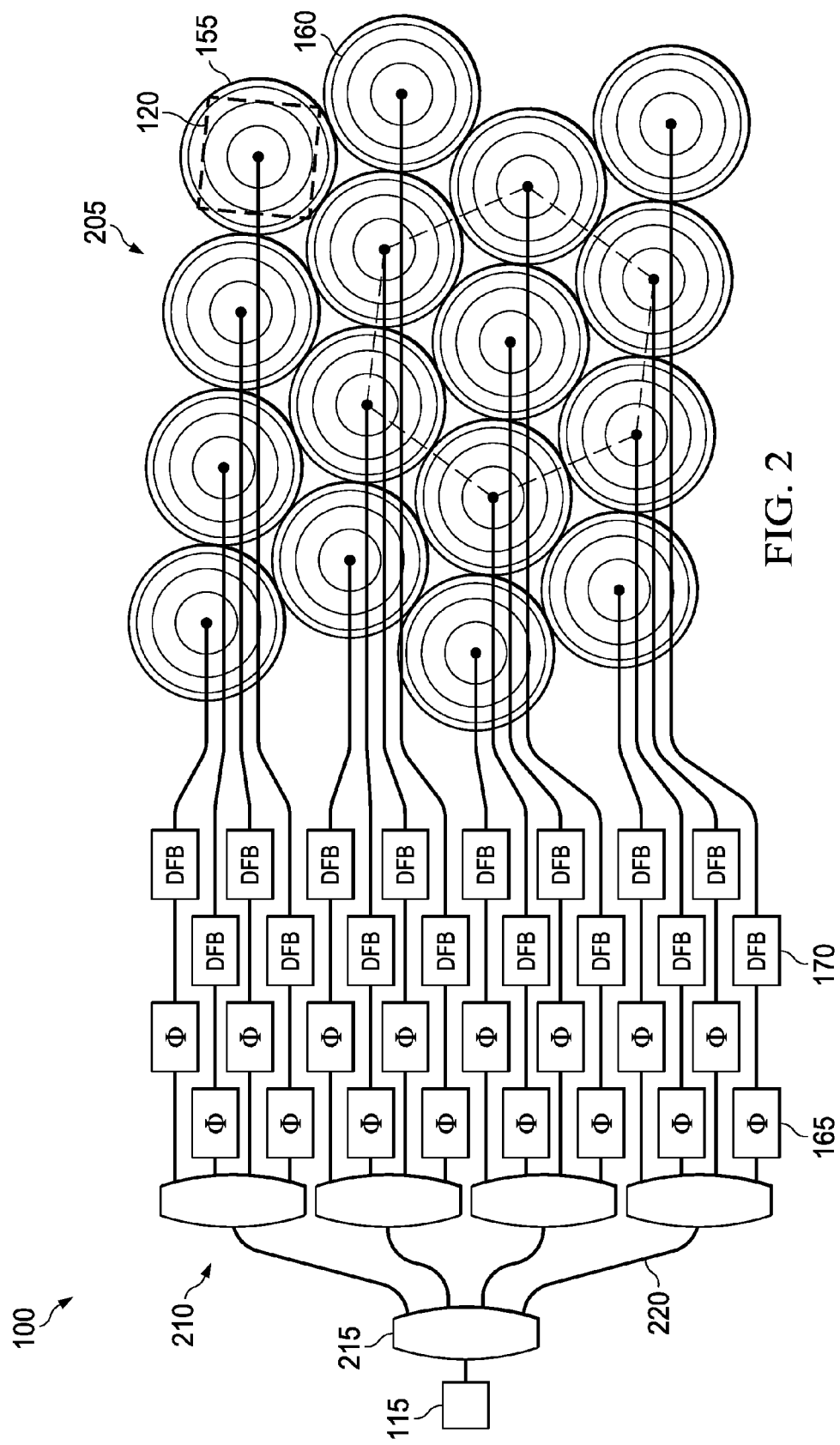
FIG. 2 presents a plan view of a schematic layout of an example photonic device of the disclosure, such as the devices depicted in FIGS. 1A-1B.
Figure 3:
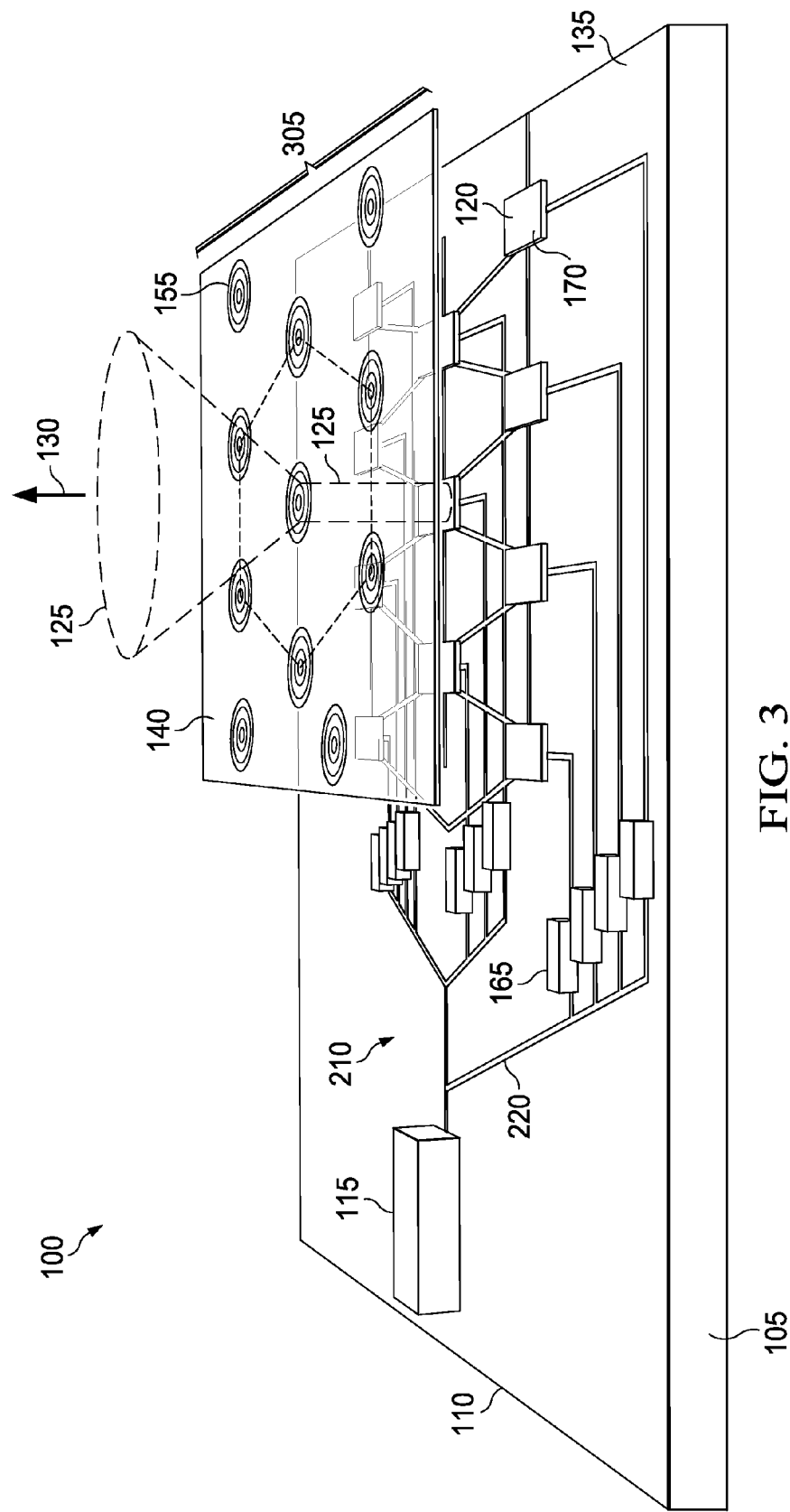
FIG. 3 presents a perspective view of a schematic layout of an example photonic device of the disclosure, such as the devices depicted in FIGS. 1A-1B.

FIG. 2 presents a plan view of a schematic layout of an example photonic device 100, such as the devices 100 depicted in FIGS. 1A-1B. FIG. 3 presents a perspective view of portions of a similar device 100. The device 100 can include an array 205 of the vertical couplers 120. As shown in FIGS. 2-3, each one of the vertical couplers 120 is optically coupled to the primary laser light source 115 by branching waveguide portions 210 of the light-guiding layer 110 (FIGS. 1A-1B). The branching waveguide portions 210 can include one or more passive power splitters 215 (e.g., waveguide beam splitters) and passive waveguides 220 such that the branching structures 210 optically connects the primary laser 115 to the vertical couplers 120.

As illustrated in FIGS. 2 and 3, embodiments of the device 100 can include a plurality of micro-lenses 155. Each of the micro-lenses 155 can be optically coupled to individual ones of the vertical couplers 120. Each micro-lens 155 can be configured to collimate the light beam 125 that is emitted from the vertical coupler 120 in the substantially perpendicular direction 130. As further illustrated in FIG. 3, the plurality of micro-lenses 155 can be arranged in a common plane 305 that is parallel with the substrate 105 plane 135. In some cases, to minimize side lobes of the light 125 emitted, it is desirable for the micro-lenses 155 to be arranged in a hexagonal symmetry (dashed lines FIGS. 2-3), although other arrangements could be used.

As illustrated in FIG. 2, some embodiments of the device include a plurality of discrete phase modulators 165 and amplitude modulators 170. Each one of the phase modulators 165 can be in a light path between the primary laser light source 115 and at least one of the vertical couplers 120. Each one of the amplitude modulators 170 can be in a light path between the primary laser light source 115 and at least one of the vertical couplers 120.

In some embodiments, such as illustrated in FIG. 3, the plurality of amplitude modulators 170 can be incorporated into the vertical couplers 120 (e.g., vertical coupler can include an amplitude modulator). In such embodiments, a grating 145 pattern of each one of the vertical couplers 120 (FIGS. 1A-1C) can be configured to both direct the light beam 125 in the substantially perpendicular direction and to amplitude modulate the light beam 125.

Various embodiments of the device 100 discussed below in the context of FIGS. 4-8 present non-limiting examples of how the components of the device 100 can be arrange to provide a more compact device configurations or reduce power requirements. For clarity, in some cases, only a partial layout is depicted.

Figure 4:
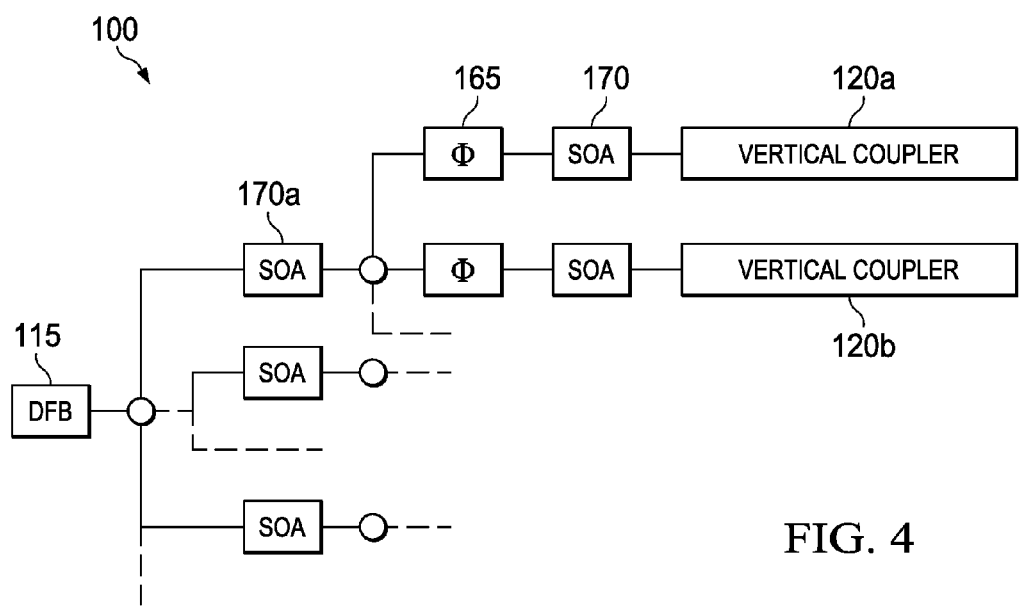

FIG. 4 presents a plan view of a schematic layout of an example photonic device 100, such as the devices 100 depicted in FIGS. 1A-1B. As shown in FIG. 4, the device 100 includes a plurality of phase modulators 165 and a plurality of amplitude modulators 170 arranged in the light path similar to that discussed in the context of FIGS. 1A-3 above. For the embodiment shown in FIG. 4, at least one of the plurality of phase modulators 165 or at least one of the plurality of amplitude modulators 170 are in a light path that is common to at least two of the vertical couplers 120. For instance as shown in FIG. 4, at least one amplitude modulator 170a is in a light path that is common to a vertical coupler 120a and another vertical coupler 120b.

FIG. 5 presents a plan view of another schematic layout of an example photonic device 100, such as the devices 100 depicted in FIGS. 1A-1B. As shown in FIG. 4, the device 100 includes phase modulators 165 and amplitude modulators 170. In this embodiment, however, the amplitude modulators 170 (e.g., secondary DBF or DFR lasers), are integrated with individual vertical couplers 120. In this embodiment both phase modulators 165 and amplitude modulators 170 can be in a light path that is common to two or more of the vertical couplers 120 (e.g., couplers 120a and 120b).

FIG. 6 presents a plan view of another schematic layout of an example photonic device 100, such as the devices 100 depicted in FIGS. 1A-1B. As shown in FIG. 4, the device 100 includes phase modulators 165 and amplitude modulators 170. In this embodiment, however, discrete the amplitude modulators 170, configured as ring lasers, are in the light path between the primary laser 115 and vertical couplers 120. Similar to the embodiment shown in FIG. 5, both phase modulators 165 and amplitude modulators 170 can be in a light path that is common to two or more of the vertical couplers 120. The wave-guiding part of the ring laser 170 (e.g., portion of the light guiding layer 110, FIG. 1A, configured as a ring laser) close enough to the passive waveguide portions 220 (e.g., that comes from a phase modulator 165) so that the light beam 125 (FIG. 1A) couples into the ring laser 170. In some embodiments, the ring lasers 170 are substantially separated and decoupled from each other. That is, each of the ring lasers 170 are sufficiently separated from each other to have no substantial influence on their nearest neighbor ring laser 170.

Figure 7:
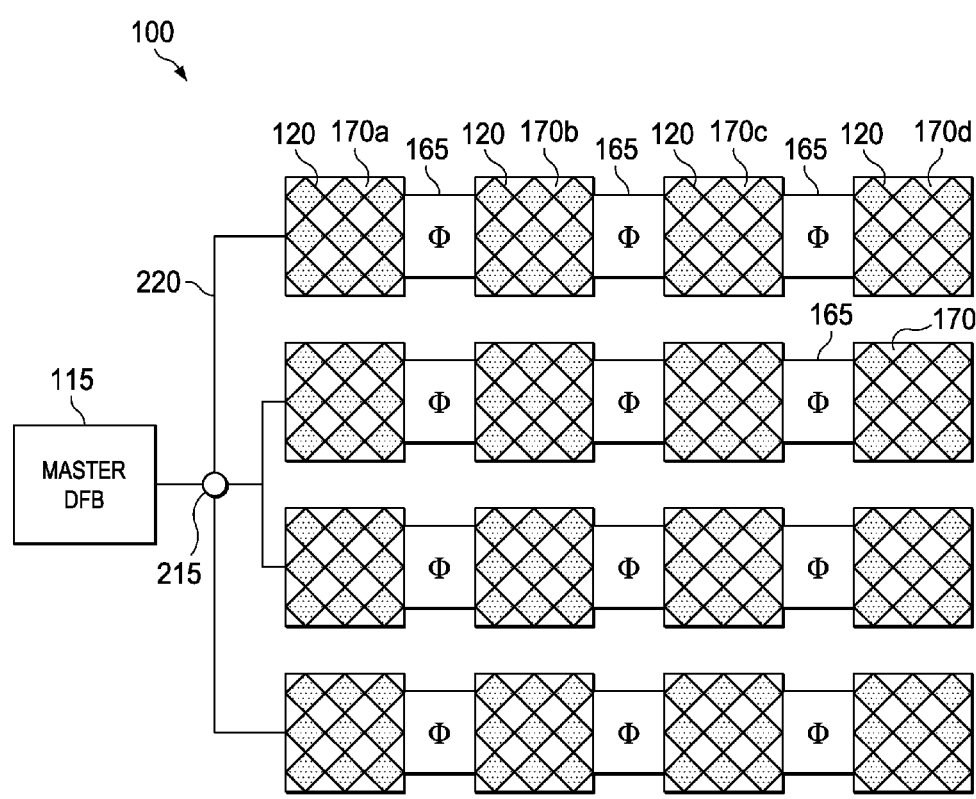

FIG. 7 presents a plan view of another schematic layout of an example photonic device 100, such as the devices 100 depicted in FIGS. 1A-1B. Similar to the embodiment depicted in FIG. 6, both phase modulators 165 and amplitude modulators 170 can be in a light path that is common to two or more of the vertical couplers 120. In this embodiment, amplitude modulators 170 (e.g., secondary DBF or DFR lasers, or ring lasers), are integrated with individual vertical couplers 120. Two or more of the amplitude modulators 170 can be optically coupled. For instance, the primary laser 115 can injection-lock the first amplitude modulators 170a, but some light inside the first amplitude modulators 170a can be coupled back into the light path going to the second amplitude modulators 170b, and so on, to the other amplitude modulators 170c, 170d in the common light path. Through this cascade effect, the primary laser 115 can control the vertical light emission from a plurality the vertical couplers 120 having integrated amplitude modulators 170. This configuration can reduce the need for waveguide branching and reduce power requirements as compared to devices with discrete and optically separated amplitude modulators.

Figure 8:
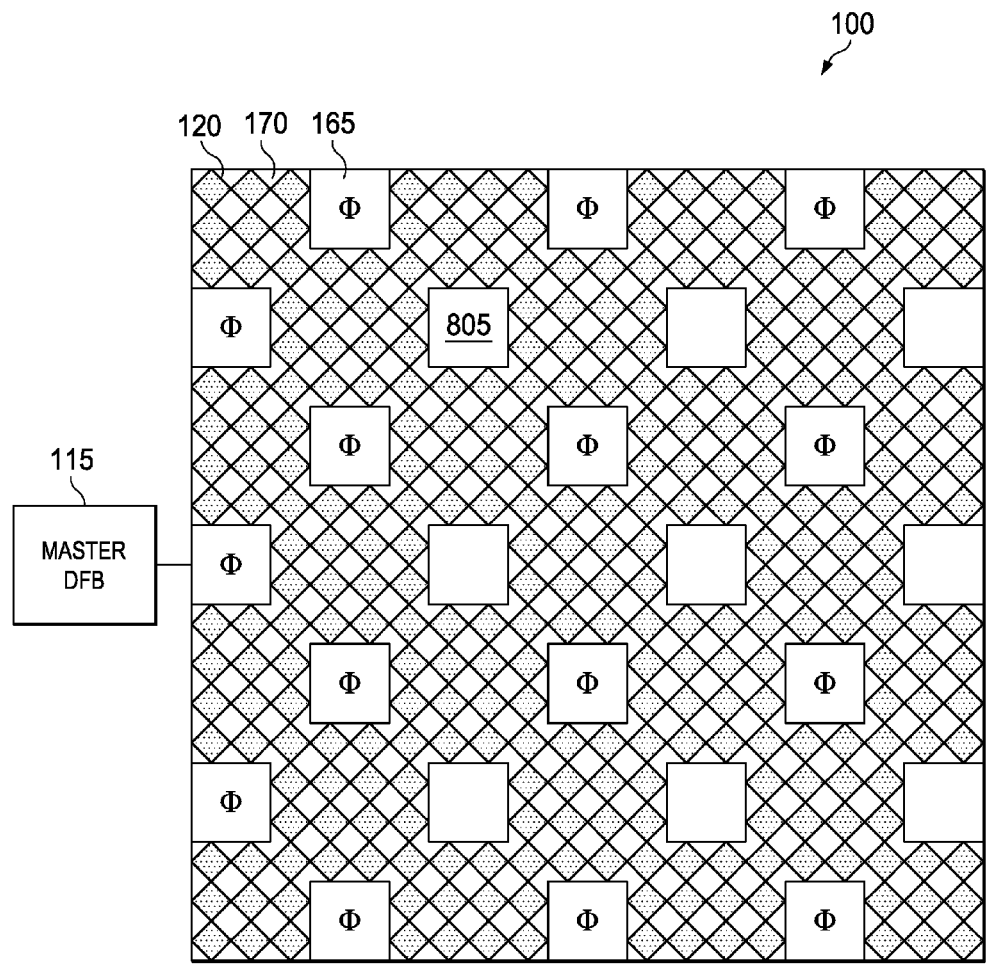

FIG. 8 presents a plan view of another schematic layout of an example photonic device 100, such as the devices 100 depicted in FIGS. 1A-1B. Similar to the device depicted in FIG. 7, phase modulators 165 and amplitude modulators 170 can be in a light path that is common to two or more of the vertical couplers 120. Amplitude modulators 170 are integrated with individual vertical couplers 120, and the amplitude modulators 170 can be optically coupled. For instance, any one amplitude modulators 170 can be directly coupled to its nearest neighboring amplitude modulators 170 in two dimensions and indirectly optically coupled to any of the other amplitude modulators 170. In some embodiments where the amplifier modulator are all coupled, the primary laser 115 itself may be one the amplitude modulators 170.

As shown in FIG. 8, the vertical couplers 120 with integrated amplitude modulators 170 can be separated from each other by a phase modulator 165. In some cases, to reduce optical leakage between selected ones of the vertical couplers 120, one or more absorbers 805 can be located in the light path between one vertical coupler 120 and another adjacent vertical coupler 120. For example, the absorber 805 can be or include a portion of the light guiding layer 110 (FIG. 1A) that is appropriately doped to absorb light at the frequency of the light produced by the primary laser 115. In some embodiments, the absorber 805 can be or include an opening in the light guiding layer 115.

Figure 9:
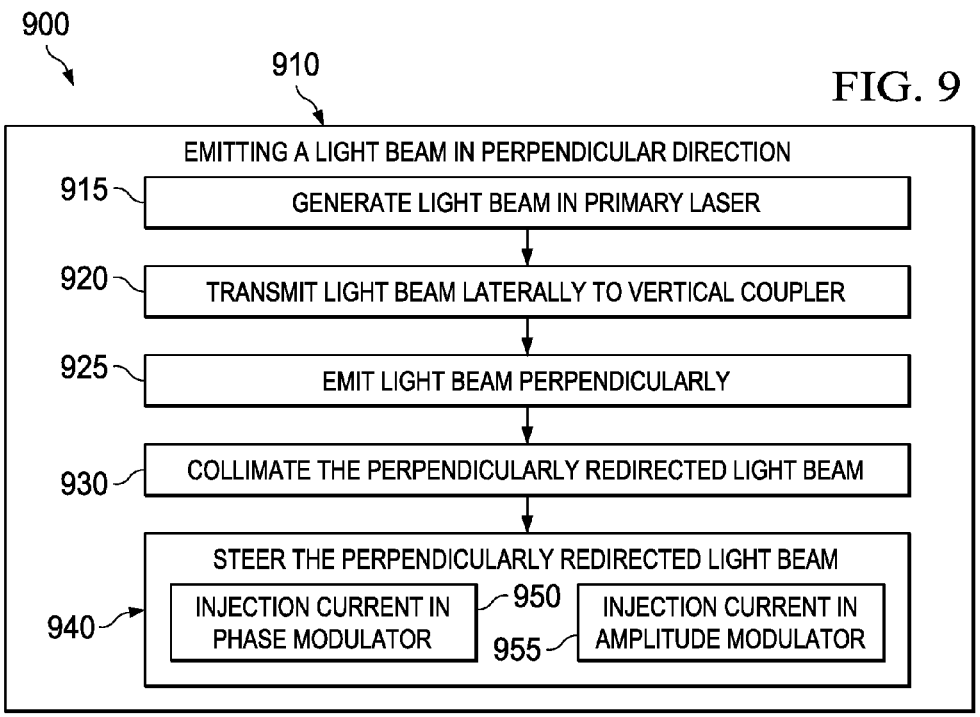
FIG. 9 presents a flow diagram of an example method of using a photonic device of the disclosure such as shown in FIGS. 1-8.

Another embodiment of the disclosure is method of using a photonic device. FIG. 9 presents a flow diagram of an example method 900 of using a photonic device such as shown in FIGS. 1-8. With continuing reference to FIGS. 1A-8 throughout, the method of using the device 100 comprises a step 910 of emitting a light beam 125 in a direction 130 that is perpendicular to a surface 135 of a planar substrate 105 of the device 100. Emitting the light beam 125 in step 910 includes a step 915 of generating a light beam 125 in a primary laser 115 in a light-guiding layer 115 located on the planar substrate 105. Emitting the light beam 125 in step 910 includes a step 920 of transmitting the light beam 125 laterally through waveguiding portions 210 of said light guiding layer 110 to a vertical coupler 120. Emitting the light beam 125 in step 910 includes a step 925 of redirecting the light beam 135 through the vertical coupler 120 in the substantially perpendicular direction 130.

In some embodiments, emitting the light beam 125 in step 910 further includes a step 930 of collimating the redirected, e.g., the perpendicularly emitted, light beam 125 including passing the light beam 125 from the vertical coupler 120 through a micro-lens 155. In some embodiments, emitting the light beam 125 in step 910 further includes a step 940 of steering the substantially perpendicularly directed light beam 125. Steering the light beam in step 940 can include injecting discrete currents through one or more of a phase modulator 165 (step 950) and through an amplitude modulator 170 (step 955) that are both located in an optical path between the primary laser 115 and the vertical coupler 120. In some cases, the currents injected in steps 950, 955 to each of a plurality of phase modulators 165 and amplitude modulators 170 are adjusted according to a Chebyshev excitation function. An advantage in using such an excitation function is to minimize side-lobe levels in the vertically emitted light. One skilled in the art would understand how to adjust the injection currents through the phase and amplitude modulators so that the phase and power the light traveling to the vertical couplers 120 matches a Chebyshev distribution function.

Figure 10:
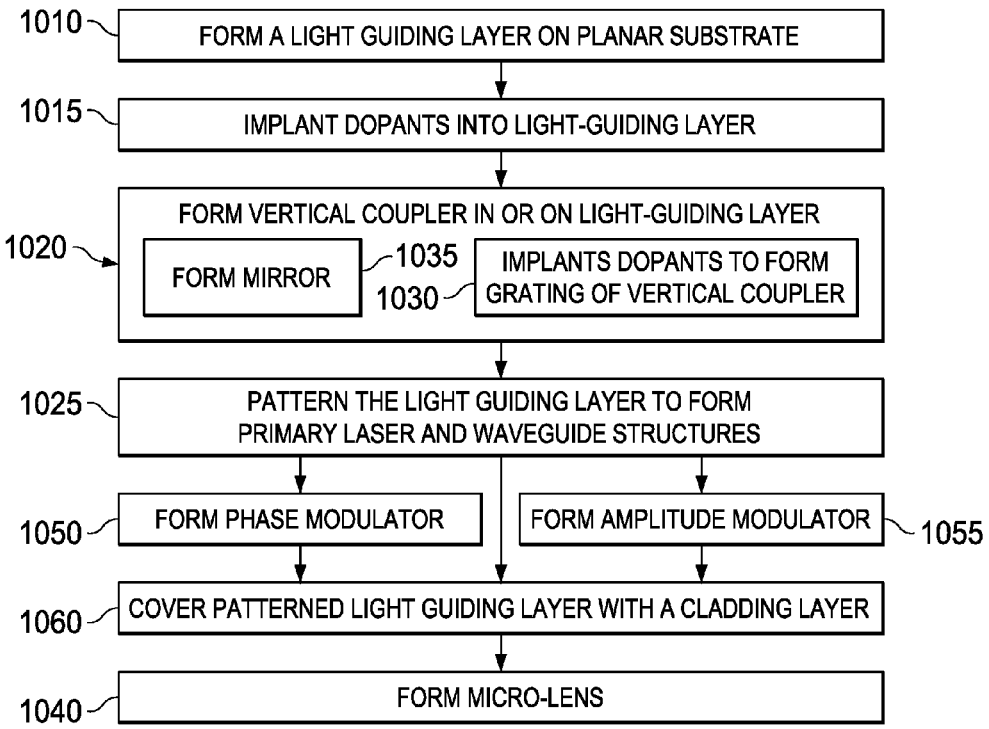
FIG. 10 presents a flow diagram of an example method of manufacturing a photonic device of the disclosure such as shown in FIGS. 1-8.

Another embodiment of the disclosure is method of manufacturing a photonic device. FIG. 10 presents a flow diagram of an example method 1000 of manufacturing a photonic device such as shown in FIGS. 1A-8. With continuing reference to FIGS. 1A-8 throughout, the method of manufacture comprises a step 1010 of forming a light-guiding layer 115 on a planar semiconductor substrate 105. The method of manufacture also comprises a step 1015 of implanting dopants into portions of the light-guiding layer to at least form grating structures for a primary laser 115. The method of manufacture also comprises a step 1020 of forming a vertical coupler 120 on or in the light-guiding layer 115. The method of manufacture also comprises a step 1025 of patterning the light-guiding layer 110 to at least form the primary laser 115 light source and waveguide structures 210 that optically couple the primary laser light source and the vertical coupler 120.

In some cases, to form the light-guiding layer 115 in step 1010 portions of a semiconductor substrate (e.g., GaAs or InP compound semiconductor substrates) can be implanted with dopants (e.g., GaAs compound semiconductor substrate can be doped with In and P; an InP compound semiconductor substrate can be doped with Ga and As) and then annealed to form a light-guiding layer 115 with the appropriate refractive index. One skilled in the art would be familiar with other procedures that could be used to form the light-guiding layer 115 such as deposition, crystal growth or bonding processes.

In some cases, implanting dopants in step 1015 includes implantation into portions of the light guiding layer 115 to form gratings of laser cavities for DBF, DBR and ring lasers configured to serve as the primary laser 115. In some cases, implanting dopants in step 1015 can also include implantation in different portions of the light guiding layer 115 to form grating 145 for certain embodiments of the vertical coupler 120, as part of step 1020. Alternatively, separate implantation processes can be performed to form the grating 145 of the vertical coupler as part of step 1020, if desired.

One skilled in the art would be familiar with lithographic and etching processes to form laser cavities for DBF, DBR and ring lasers, in accordance with the patterning step 1025. In some cases patterning step 1025 can also include patterning components of the vertical coupler 120 as part of step 1020. Alternatively, separate patterning processes can be performed as part of step 1020, if desired. For instance, forming the vertical coupler 120 in step 1020 can include a step 1030 of implanting dopants in different portions of the light-guiding layer 115 to form a grating 145 of the vertical coupler 120. As noted above, in some cases step 1035 can be performed as part of step 1015.

Forming the vertical coupler 120 in step 1020 can include a step 1035 of forming a mirror 150. Forming the mirror 150 in step 1030 can including etching a surface 180 of the light guiding layer 115 (FIG. 1B) to form a planar diagonal surface 182 that forms a diagonal angle 185 of the mirror 150 with respect to a surface 135 of the planar substrate 105. Forming the mirror in step 1030 can include further depositing a reflective coating on the planar diagonal surface 182.

In some cases, the planar diagonal surface 182 forms an angle 185 of about 45 degrees with respect to the planar substrate 105. In other cases, the chemical etch of the surface 180 exposes a natural crystal plane of the light guiding layer 115 and the natural plane is not 45 degrees. For instance, in some cases the diagonal angle 185 can equal about 53 degrees. This, in turn, can cause the light beam 125 to emit from the vertical coupler 120 in a direction 130 that is not exactly perpendicular to substrate surface 135 but which is still substantially perpendicular (e.g., 90±10 degrees). In some cases, as further discussed elsewhere herein, it is desirable to correct such imperfections using a micro-lens 155 optically coupled to the vertical coupler 120, such as discussed above in the context of FIG. 1C.

Some embodiments of the method further include a step 1040 of forming a micro-lens 155. Forming the micro-lens 155 configured as a diffractive micro-lens in step 140 can include patterning a surface 135 of the substrate 105 (FIG. 1B), or, a surface 135 of a cladding layer 140 located on the substrate 105 (FIG. 1A) to form substantially concentric ridges 160 of the lens. In some preferred embodiments, the micro-lens 155 is formed to be large enough to capture substantially of the light 125 emitted from the vertical coupler 120 in the perpendicular direction 130. Consider for example a vertical coupler that comprises a square 50×50 micron square array of grating 145 elements. The micron-lens 155 would preferably have a diameter greater than 50 microns and in the range of 50 to 100 microns.

Some embodiments of the method further include a step 1050 of forming phase modulator structures 165 in the light guiding layer 115 and a step 1055 of forming amplitude modulator structures 170 in the light guiding layer 115. In some embodiments, for example, implanting the dopants in step 1015 further includes implanting the dopants in different portions of the light-guiding layer 115 that correspond to the phase modulator and amplitude modulator structures 165, 170 as part of steps 1050, 1055. In some embodiments, for example, patterning in step 1015 further includes forming light-guiding portions of the phase modulator and said amplitude modulator structures 165, 170, as part of steps 1050, 1055. In other cases however, discrete implantation and patterning processes can be performed as part of steps 1050, 1055. One skilled in the art would understand that forming the phase modulator and amplitude modulator structures 165, 170 would include additional steps such as the deposition of electrode structures (not shown) on or adjacent to the light-guiding portions of these structures 165, 170 and the formation conductive lines (not shown) that are coupled to the electrodes.

Some embodiments of the method further include a step 1060 of covering the patterned light-guiding layer 115 with a cladding layer 140. Similar procedures as described for step 1010 can be used to cover the patterned light-guiding layer with a cladding layer 140 in step 1065. In such embodiments, the patterned light-guiding layer 115 is a buried layer. E.g., the primary laser 115, the passive branching structures waveguide portions 210, the phase or amplitude modulators 165, 170 and the vertical coupler 120 are buried. One advantage of such a buried layer is that heat transfer away from the lasing portions of the light guiding layer 115 is facilitated as compared to an unburied (e.g., air-clad) light-guiding layer 115.

Having described certain aspects of the present disclosure, it is believed that additional features will become even more apparent by reference to the following further example embodiments. It will be appreciated that the examples are presented solely for the purpose of illustration and should not be construed as limiting the disclosure.

Some embodiments of the disclosure include a device having an array of vertical emitting lasers to generate a single or multiple free-space optical beams with minimum beam width, minimum level of side lobes and minimum grating lobes whose orientation can be quickly readjusted by the electronic control of phase and amplitude of the individual emitters in the array.

In some embodiments of the device, a free-space beam forming with fast and precise steering properties is generated by a hexagonal planar array of integrated vertically emitting injection-locked DFBs, each one including a vertical grating coupler, phase shifter and a diffractive microlens. The resulting beam is characterized by an optimal minimal side lobe level with a prescribed main beam width. Beam steering is achieved by controlling both phase and amplitude of the individual emitting elements according to a prescribed Chevyshev distribution function. The hexagonal configuration can provide the same distance between nearest neighboring emitting elements which contributed to the reduction of spurious emission grating lobes as compared to rectangular arrays In some of the devices include a photonic crystal injection-locked vertically coupled 2-dimensional DFB vertical-emitting (VE) element used as an emitting element of the array. Embodiments of the VE emitting element can combine a 2-D active lasing cavity, a vertically coupling grating, and integrated diffractive microlens in a single structure. Some embodiments of the array can include a photonic crystal surface emitting 2-D VE DFB elements for enhanced efficiency and radiating power synchronized in frequency by a cascaded injection-locking mechanism. Multiple beams can be synthesized by superimposing the corresponding aperture distribution functions over the arrayed elements.

Some embodiments of the device include an array Photonic Integrated Circuit (PIC) which uses a common on-chip integrated horizontal DFB master oscillator to optically injection-lock all of the array elements, as illustrated in FIG. 2. This procedure helps ensure that each vertically emitting arrayed light source oscillates with exactly the same frequency and with a definable, fixed phase relationship controlled by its integrated phase shifter. A grating-containing vertical coupler and a microlens project the light in the vertical direction with large divergence for large scanning angle. In some cases, a linear 1-D DFB with an integrated passive coupler can be used. In other cases, the grating-containing vertical coupler can be integrated with a photonic crystal 2-D DFB surface emitting lasing element for better beam shape and wall-plug efficiency. Lasers, phase shifters and the passive interconnect circuitry (e.g., waveguides) can be monolithically integrated on the same substrate (e.g., InP or GaAs substrates) using passive-active integration techniques well known to those skilled in the art.

In some embodiments of the device, to achieve optimal coherent optical beam forming and steering of the arrayed injection-locked lasing elements, radiating elements are arrayed in a hexagonal grid with equal spacing among nearest neighbors. This arrangement helps to minimize parasitic adjacent strong grating lobes compared to other configurations such as rectangular arrangements. An appropriate macro-optical lens positioned above the hexagonal arrayed radiating elements effectively reduces the emitter array's pitch and suppresses most of the unwanted side-lobe level (SLL) emission to improve the Instantaneous Field of View (IFOV) and the total FOV. The array also reduces the number of elements required to allow scanning across a fixed solid angular aperture.

In some cases, a minimum beam width of the main emission lobe can be synthesized from hexagonal arrayed emission elements excited according to a Chebyshev excitation function in order to achieve a minimum specified SLL. The emission amplitude of each element is controlled by adjusting the current injected into the individual slave DFB while a relative phase shift is obtained by injecting a small amount of current into the short passive optical waveguide section of the integrated phase shifter.

Some embodiments of the device use a highly efficient photonic crystal vertical emitting 2-D DFB lasing element for the emitting array by integrating the vertical emission coupler with the DFB lasing medium. The injection-locked active 2-D photonic crystal laser element will generate uniform emission perpendicular to the 2-D cavity plane, as illustrated in FIG. 3. This innovative 2-D vertically emitting DFB (VE-DFB) relies upon a planar (e.g., square) cavity defined by a 2-D periodic corrugation of the refractive index (e.g., 2D modulation of the refractive index of the wave-guiding layer that comprises the vertical coupler).

Instead of the canonical half wavelength period used in some linear DFB lasers, in some embodiments of the device, the 2-D corrugation equals a full wavelength. As the lasing is achieved via distributed feedback (DFB) mechanisms, the 2-D DFB is different from other planar structures based on photonic crystal that use lattice defects. This facilitates achieving a uniform optical emission over the emitter and minimizes the intensity for a given total power. The laser may oscillate on either side of the photonic bandgap determined by the corrugation, where the group velocity is zero. This choice for the grating period causes light to be emitted essentially normal to the cavity plane. Lasing is expected to be uniform over the entire 2-D lattice and, for sufficiently large cavities, light can be out-coupled vertically with a narrow divergence angle (e.g., about 1 degree). A unique asymmetric shape of the corrugation elements (e.g., elliptical) can be delineated to control the polarization of the emission.

Some 2-D DFB lasers can use wafer bonding to achieve a very high index contrast in the lattice, but, with lower than desired yields and unstable room temperature lasing oscillation. To mitigate these issues in embodiments of the device use buried structures with larger surface areas in order to increase the fill factor. This also reduces scattering by each lattice element due to the lower index contrast. The advantage of a 2-D VE-DFB over other surface emitting lasers, such as VCSELs and circular grating lasers, is that the laser can be made arbitrarily large and still emit in only a single mode that extends uniformly over the entire 2-D lattice. Also, the VE-DFB can be injection-locked with an in-plane traveling optical signal rather than a vertical traveling optical signal, such as used for some VCSELs, thereby facilitating the construction of the PIC for injection-locking all the elements of the device.

To facilitate all sources in the array being coherently combined into the final output beam, all VE-DFBs can be synchronized by a master optical oscillator (MO) (e.g., a primary laser light source) through injection-locking. In some embodiments light from the MO, whose wavelength is close to either of the zero-group velocity points of the VE-DFBs, is fed into the slave VE-DFBs (e.g., amplitude modulator), thereby forcing the slave to oscillate with the same wavelength as the master. After all the slaves VE-DFBs are locked with prescribed phase offsets, the entire array behaves as a single coherent optical source.

The embodiment depicted in FIG. 4 comprises separate phase modulators and amplitude modulators (e.g., semiconductor optical amplifier (SOA). Embodiments of the vertical coupler include an etched mirror, a second order (2D) grating on top of a tapered passive light guiding layer, or a second order (2D) grating on top of a SOA. Some advantages of such embodiments can include: 1) the use of a single laser source therefore no injection locking is needed; 2) the SOAs can be maintained close to the facet thereby minimizing loses; 3) the power consumption of the device can be adjusted to fit tight specification ranges; 4) polarization issues are minimized; 5) the use of etch mirrors provides good output mode; 6) simple micro-lens optics may be used; 7) the phase modulator and amplitude modulator can be combined; 8) the DBF primary laser source can be tunable; 9) the device can be monolithically integrated; 10) amplitude control is simple. Some challenges of such embodiment can include: 1) manufacturing large scales (e.g., 200 discrete elements); 2) co-integration of micro-optics; 3) verifying the performance of vertical couplers; 4) developing control loops for phase shifters; 5) verifying coherent beam forming and beam quality.

The embodiment depicted in FIG. 5 comprises separate phase modulators and amplitude modulators (e.g., DFB or DBR lasers). Embodiments of the vertical coupler include an etched mirror, or a second order (2D) grating on top of a tapered passive light guiding layer. Some advantages of such embodiments can include: 1) the amplifier can be maintained close to the facet thereby minimizing loses; 2) the power consumption of the device can be adjusted to fit tight specification ranges; 3) polarization issues are minimized; 4) the use of etch mirrors provides good output mode; 5) the device's construction can include wafer bonding approaches. Some challenges of such embodiments can include: 1) verifying the stability of injection locking mechanisms; 2) developing amplitude control; 3) homogeneous construction methods to manufacture large numbers of DFB or DBR amplitude modulators; 4) sensitivity to local or global temperatures.

The embodiment depicted in FIG. 6 comprises separate phase modulators and amplitude modulators (e.g., ring lasers). Embodiments of the vertical coupler include an etched mirror, or a second order (2D) grating on top of a tapered passive light guiding layer. Some advantages of such embodiments can include: 1) the amplifier can be maintained close to the facet thereby minimizing loses; 2) the power consumption of the device can be adjusted to fit tight specification ranges; 3) facet problems are removed; 4) polarization issues are minimized; 5) the use of etch mirrors provides good output mode; 6) simple micro-lens optics may be used; 7) the device's construction can include wafer bonding approaches. Some challenges of such embodiments can include: 1) verifying the stability of injection locking mechanisms; 2) developing amplitude control; 3) homogeneous construction methods to manufacture large numbers of DFB or DBR amplitude modulators; 4) sensitivity to local or global temperature variations.

The embodiment depicted in FIG. 7 comprises separate phase modulators and amplitude modulators that are integrated with vertical couplers. Embodiments of the vertical coupler include a second order (2D) grating with both vertical coupling and DBF capabilities. Some advantages of such embodiments can include: 1) the amplifier can be maintained close to the facet thereby minimizing loses; 2) the device's construction can include wafer bonding approaches; 3) a more compact design by integrating amplitude modulation and vertical light coupling into a vertical emitting photonic crystal DFB array. Some challenges of such embodiments can include: 1) reduce yields of functional devices; 2) maintaining the stability of injection locking; 3) complex control schemes to amplitude modulation; 4) sensitivity to local or global temperature variations; 5) reduced quality of the vertically emitted beam; 6) difficulty maintaining polarization control; reducing efficiency of vertical light coupling; 7) inefficient power consumption.

The embodiment depicted in FIG. 8 comprises separate phase modulators and amplitude modulators that are integrated with vertical couplers. Embodiments of the vertical coupler include a second order (2D) grating with both vertical coupling and DBF capabilities. Absorbers can be incorporated between arrays of the vertical couplers. Some advantages of such embodiments can include: 1) the amplifier can be maintained close to the facet thereby minimizing loses; 2) the device's construction can include wafer bonding approaches; 3) a more compact design by integrating amplitude modulation and vertical light coupling into a vertical emitting photonic crystal DFB array; 4) may not need an external primary laser light source (e.g., the primary laser can be within the array of vertical couplers of vertical emitting photonic crystal DFB arrays and phase modulators. Some challenges of such embodiments can include: 1) reduce yields of functional devices; 2) maintaining the stability of injection locking; 3) complex control schemes to amplitude modulation; 4) sensitivity to local or global temperature variations; 5) reduced quality of the vertically emitted beam; 6) difficulty maintaining polarization control; reducing efficiency of vertical light coupling; 7) inefficient power consumption.

Figure 11A:
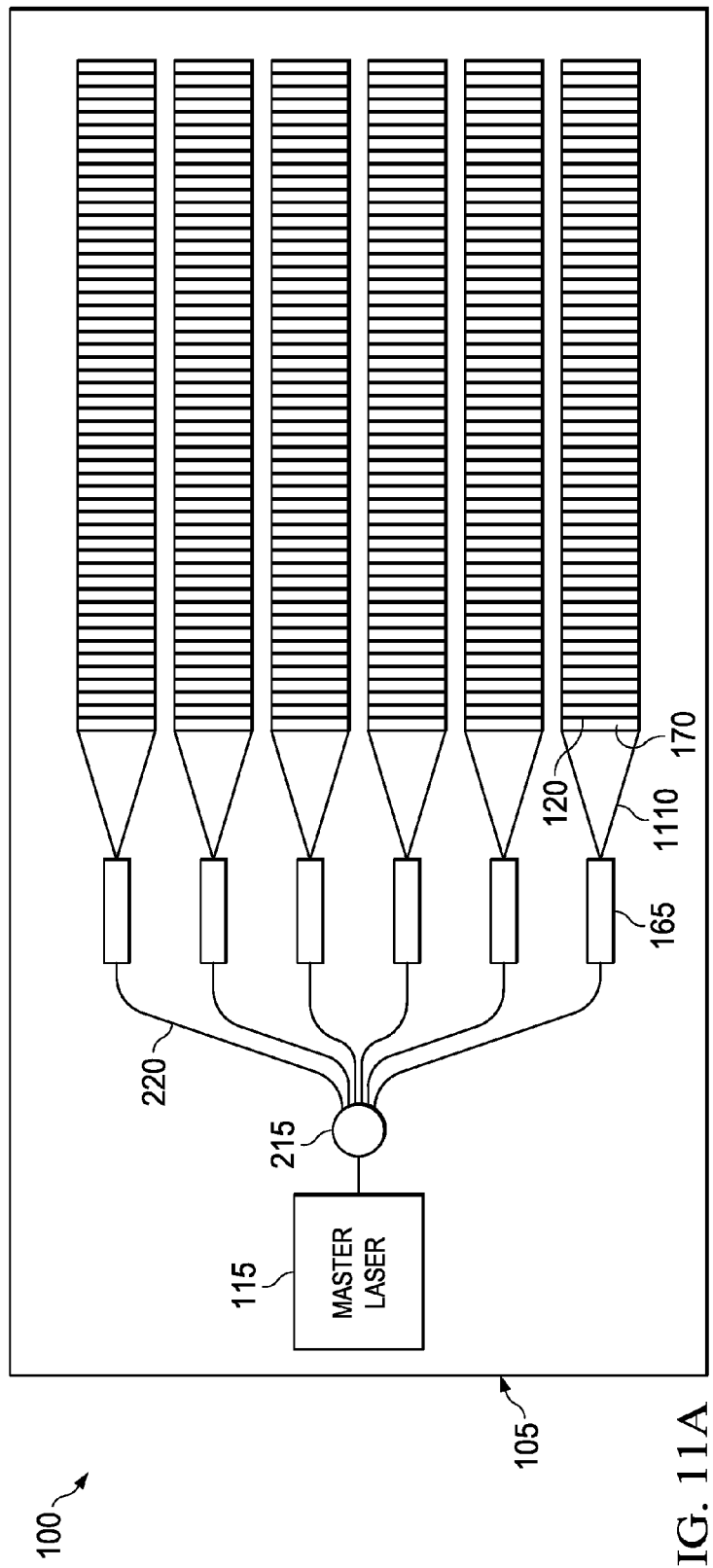
FIGS. 11A and 11B present a schematic layout and conceptual drawing, respectively, of an example photonic device of the disclosure, that includes a vertical coupler with an 1D grating and integrated amplitude modulator.
Figure 11B:
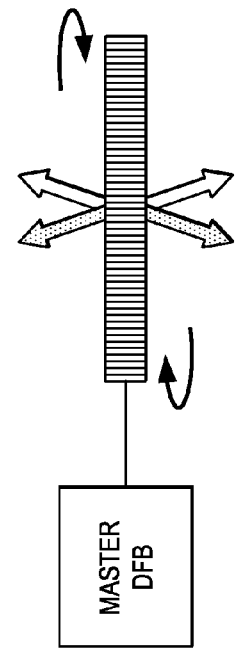

The device 100 embodiment depicted in FIG. 11A comprises separate phase modulators 165, and, amplitude modulators 170 that are integrated with vertical couplers 120. Embodiments of the vertical coupler 120 include a first order (1D) grating with both vertical coupling and DBF capabilities. Waveguide tapers 1110 can facilitate coupling between the phase modulators 165 and vertical couplers 120 (e.g., with their integrated amplitude modulators 170). Some embodiments of the 1D DFB lasers preferably have a period of $\lambda$, where $\lambda$ equals the wavelength of the light emitted by the primary laser 105. In some embodiments beam steering is achieved by adjusting the wavelength in one dimension and adjusting the phase modulators in the other direction. In some cases, the 1D lasers can generate 2D beam is that the light coming out of the 1D laser is very elliptical and it can be challenging for micro-lens (not shown) to combine elliptical beams into a single collimated spherical beam. As shown in the inset diagram (FIG. 1B), one challenge of such embodiments includes light traveling bi-directionally inside of the laser cavity, and therefore four diffracted beams: two beam going in one direction (e.g., solid arrows pointing to the right in the inset) and two beams going in an opposite direction (e.g., hatched arrows pointing to the left in the inset). In some embodiments, the symmetry can be partially broken by using an asymmetric grating that eliminates pair orders aligned along the same line. In some embodiments, remaining spurious order (arrows pointing down in the inset) can be substantially canceled by positioning an appropriate mirror (e.g., a separate diffraction grating) underneath the laser medium so that the light is constructively reoriented along only the vertically coupled beam.

Although the embodiments have been described in detail, those of ordinary skill in the art should understand that they could make various changes, substitutions and alterations herein without departing from the scope of the disclosure.

What is claimed is:

1. An optical device, comprising:
   a planar semiconductor substrate having a light-guiding layer thereon;
   a primary laser light source in said light-guiding layer; and
   a vertical coupler optically coupled to said primary laser light source by intervening waveguide portions of said light-guiding layer located between the primary laser light source and the vertical coupler, wherein said vertical coupler is configured to receive a light beam from said primary laser light source and redirect said light beam in a direction that is substantially perpendicular to a surface of said planar substrate and further including an amplitude modulator located in a light path between said primary laser light source and said vertical coupler and said amplitude modulator is configured to receive a light beam from said primary laser light source, wherein said amplitude modulator includes one or more secondary DFB laser, DRB laser, ring laser or semiconductor optical amplifier integrated into said vertical coupler.

2. The device of claim 1, wherein said vertical coupler includes a grating located adjacent to or within said light-guiding layer, said grating configured to redirect said light beam from said primary laser light source to said substantially perpendicular direction.

3. The device of claim 2, wherein said grating is one of a one-dimensional grating or a two-dimensional grating.

4. The device of claim 1, wherein said vertical coupler includes a mirror located adjacent to or within said light-guiding layer, said mirror configured to redirect said light beam from said primary laser light source to said substantially perpendicular direction.

5. The device of claim 1, wherein at least a portion of said planar semiconductor substrate is configured as a lower cladding layer for said light-guiding layer and said device further includes an upper cladding layer.

6. The device of claim 1, further including a micro-lens optically coupled to said vertical coupler, said micro-lens configured to collimate said light beam emitted from said vertical coupler in said substantially perpendicular direction.

7. The device of claim 6, wherein said micro-lens is configured as a diffractive micro lens as part of an outer surface of said semiconductor substrate.

8. The device of claim 7, wherein at least a portion of said planar semiconductor substrate is configured as a cladding layer for said light-guiding layer and said diffractive micro lens is part of the outer surface of the cladding layer.

9. The device of claim 1, further including a phase modulator located in a light path between said primary laser light source and said vertical coupler.

10. The device of claim 1, wherein said vertical coupler includes a grating pattern that is configured to both direct said light beam in said substantial perpendicular direction and to amplitude modulate said light beam.

11. An optical device, comprising:
    a planar semiconductor substrate having a light-guiding layer thereon;
    a primary laser light source in said light-guiding layer;
    an array of vertical couplers, each one said of said vertical couplers being optically coupled to said primary laser light source by branching waveguide portions of said light-guiding layer located between said primary laser light source and said vertical couplers, wherein said vertical couplers are configured to receive a light beam from said primary laser light source and redirect said light beam in a direction that is substantially perpendicular to a surface of said planar substrate; and
    a plurality of micro-lenses, wherein each one of said micro-lenses are optically coupled to individual ones of said vertical couplers and configured to collimate said light beam emitted from said vertical coupler in said substantially perpendicular direction, wherein said plurality of micro-lenses are arranged along a plane that is parallel with said substrate plane and are arranged to have a hexagonal symmetry.

12. The device of claim 11, wherein each of said vertical couplers includes: a grating located adjacent to or within said light-guiding layer or a mirror located adjacent to or within said light-guiding layer.

13. An optical device, comprising:
- a planar semiconductor substrate having a light-guiding layer thereon;
- a primary laser light source in said light-guiding layer;
- an array of vertical couplers, each one said of said vertical couplers being optically coupled to said primary laser light source by branching waveguide portions of said light-guiding layer located between said primary laser light source and said vertical couplers, wherein said vertical couplers are configured to receive a light beam from said primary laser light source and redirect said light beam in a direction that is substantially perpendicular to a surface of said planar substrate; and
- a plurality amplitude modulators wherein each one of said plurality of amplitude modulators are in a light path between said primary laser light source and at least one of said vertical couplers, where each one of said plurality of amplitude modulators are incorporated into said vertical couplers, wherein a grating pattern of each one of said vertical couplers is configured to both direct said light beam in said substantially perpendicular direction and to amplitude modulate said light beam.

14. The device of claim 13, wherein each of said vertical couplers includes: a grating located adjacent to or within said light-guiding layer, or, a mirror located adjacent to or within said light-guiding layer.

15. An optical device, comprising:
- a planar semiconductor substrate having a light-guiding layer thereon;
- a primary laser light source in said light-guiding layer;
- an array of vertical couplers, each one said of said vertical couplers being optically coupled to said primary laser light source by branching waveguide portions of said light-guiding layer located between said primary laser light source and said vertical couplers, wherein said vertical couplers are configured to receive a light beam from said primary laser light source and redirect said light beam in a direction that is substantially perpendicular to a surface of said planar substrate; and
- a plurality of phase modulators and a plurality of amplitude modulators, wherein at least one of said plurality of phase modulators or at least one of said plurality of amplitude modulators are in a light path that is common to at least two of said vertical couplers and,
- one or more absorbers located in said light path between one of said vertical couplers and another adjacent said vertical couplers.

16. The device of claim 15, wherein each of said vertical couplers includes: a grating located adjacent to or within said light-guiding layer, or, a mirror located adjacent to or within said light-guiding layer.

* * * * *